(12) United States Patent
Nakayama et al.

(10) Patent No.: US 8,744,387 B2
(45) Date of Patent: Jun. 3, 2014

(54) WIRELESS DEVICE AND METHOD OF DISPLAYING FREQUENCY

(71) Applicant: Jvckenwood Corporation, Yokohama (JP)

(72) Inventors: Osamu Nakayama, Yokohama (JP); Toru Kawashima, Yokohama (JP)

(73) Assignee: Jvckenwood Corporation (KR)

( * ) Notice: Subject to any disclaimer, the term of this patent is extended or adjusted under 35 U.S.C. 154(b) by 0 days.

(21) Appl. No.: 13/914,887

(22) Filed: Jun. 11, 2013

(65) Prior Publication Data

US 2014/0004811 A1 Jan. 2, 2014

(30) Foreign Application Priority Data

Jun. 29, 2012 (JP) ................................. 2012-147052

(51) Int. Cl.
*H04B 1/18* (2006.01)

(52) U.S. Cl.
USPC .................. 455/158.2; 455/226.4; 455/550.1; 345/660; 324/76.19

(58) Field of Classification Search
USPC .............. 455/67.1, 67.7, 150.1, 154.1, 158.1, 455/158.2, 161.1–161.3, 226.1, 226.4, 455/550.1; 345/660; 326/76.19
See application file for complete search history.

(56) References Cited

U.S. PATENT DOCUMENTS

| | | | | |
|---|---|---|---|---|
| 5,434,954 | A * | 7/1995 | Kawauchi et al. ............. | 345/440 |
| 5,524,281 | A * | 6/1996 | Bradley et al. ............. | 455/67.15 |
| 6,289,207 | B1 * | 9/2001 | Hudecek et al. ........... | 455/150.1 |
| 6,545,688 | B1 * | 4/2003 | Loveridge et al. ............ | 345/660 |
| 7,459,898 | B1 * | 12/2008 | Woodings .................. | 324/76.19 |

FOREIGN PATENT DOCUMENTS

JP 60249190 12/1985

\* cited by examiner

*Primary Examiner* — Nhan Le
(74) *Attorney, Agent, or Firm* — Cantor Colburn LLP

(57) ABSTRACT

The wireless device includes: a frequency setting unit which sets a frequency; a first frequency display unit which displays the set frequency as a set-up frequency in numbers; and a second frequency display unit which draws at least one predetermined frequency range, centering the set-up frequency, on a scale having a fan shape by interlocking the at least one predetermined frequency range with the setting of the frequency performed by the frequency setting unit. Here, the scale is rotated about a virtual center point having the fan shape of the scale, and a center of the scale is shown to always correspond to the set-up frequency.

8 Claims, 8 Drawing Sheets

FIG. 5

| DATA OF DETAILED FREQUENCY f1 UNDERLINE ONLY | | NUMERICAL VALUE ON SCALE | | ANGLE CORRESPONDING TO NUMERICAL VALUE ON SCALE | | | |
|---|---|---|---|---|---|---|---|
| (10, 010, 000) | → | EG 010, 000 | → | FH 109. 300° | → F MARKING | → J 010 |
| ⋮ | | | | | | |
| (10, 000, 001) | → | 000, 001 | → | 99. 301° | | |
| (10, 000, 000) | → | → EG 000, 000 | → | FH 99. 300° | → F MARKING | → J 000 |
| (9, 999, 999) | → | 999, 999 | → | 99. 299° | | |
| ⋮ | | | | | | |
| (9, 992, 700) | → | 992, 700 | → | 92. 000° | | |
| ⋮ | | | | | | |
| (9, 991, 700) | → | 991, 700 | → | 91. 000° | | |
| ⋮ | | | | | | |
| (9, 991, 001) | → | 991, 001 | → | 90. 301° | | |
| (9, 991, 000) | → | → E 991, 000 | → F | 90. 300° | → F MARKING | |
| (9, 990, 999) | → | 990, 999 | → | 90. 299° | | |
| ⋮ | | | | | | |
| (9, 990, 701) | → C | 990, 701 | → | 90. 001° | | |
| A 9, 990, 700 | ----→ B | 990, 700 | → | 90. 000° | | |
| (9, 990, 699) | → D | 990, 699 | → | 89. 999° | | |
| ⋮ | | | | | | |
| (9, 990, 001) | → | 990, 001 | → | 89. 301° | | |
| (9, 990, 000) | → | → EG 990, 000 | → | FH 89. 300° | → F MARKING | → J 990 |
| (9, 989, 999) | → | 989, 999 | → | 89. 299° | | |
| ⋮ | | | | | | |
| (9, 988, 700) | → | 989, 700 | → | 89. 000° | | |
| ⋮ | | | | | | |
| (9, 987, 700) | → | 988, 700 | → | 88. 000° | | |
| ⋮ | | | | | | |
| (9, 980, 001) | → | 980, 001 | → | 79. 301° | | |
| (9, 980, 000) | → | → EG 980, 000 | → | FH 79. 300° | → F MARKING | → J 980 |
| (9, 979, 999) | → | 979, 999 | → | 79. 299° | | |
| ⋮ | | | | | | |
| (9, 971, 000) | → | → E 971, 000 | → F | 71. 300° | → F MARKING | |

WIRELESS DEVICE AND METHOD OF DISPLAYING FREQUENCY

CROSS-REFERENCE TO RELATED PATENT APPLICATIONS

This application claims the benefit of Japanese Patent Application No. 2012-147052, filed on Jun. 29, 2012, in the Japan Patent Office, the disclosure of which is incorporated herein in its entirety by reference.

BACKGROUND OF THE INVENTION

1. Field of the Invention

The present invention relates to a wireless device and a method of displaying a frequency.

2. Description of the Related Art

In an operation where transmission and reception are performed at a predetermined frequency within a range of an assigned frequency band, like the case of amateur radio, instead of being tuned into a target frequency, a frequency is gradually increased or decreased to find a station performing transmission, and is tuned to the station.

Here, it would be easier for a user to intuitively understand in which frequency band an operating frequency is operated by displaying an analog frequency scale to indicate the operating frequency by using a pointer, in which the pointer indicates a location on a frequency scale display, or the like, rather than displaying a detailed frequency in numbers.

A patent reference 1 discloses a frequency display method for digitally displaying a frequency, in which an entire target frequency domain is divided into N sections (here, N is an integer equal to or higher than 2), and the N sections are displayed as different dots.

However, according to the patent reference 1, many dots are required in order to change a frequency in detail only at locations where dots are displayed. However, it is possible to perform a tuning operation in detail according to a display of a pointer interlocked to the tuning operation, by displaying an analog frequency scale using a liquid crystal display or the like which is capable of a detailed display.

However, a range of the analog frequency scale needs to be expanded in order to set a frequency in detail, and at this time, a moving distance of the pointer is increased. Also, since a size of a display region is limited, when, for example, a frequency is increased such that the pointer reaches a rightmost position and exceeds the rightmost position (for example, any digit that is increased for example from 1099 to 1100), the pointer has to return back toward a leftmost position.

Also, in this case, it may be a burden to a user's eyes since line-of-sight moving distances between a frequency display region in numbers and a pointer of an analog frequency scale are not uniform.

3. Prior Art Reference (Patent Reference 1) Japanese Laid-Open Patent Publication No. sho 60-249190

SUMMARY OF THE INVENTION

The present invention provides a wireless device and a method of displaying a frequency, wherein displaying of an analog frequency scale having a small line-of-sight movement is realized.

According to an aspect of the present invention, there is provided a wireless device including: a frequency setting unit which sets a frequency, a first frequency display unit which displays the set frequency as a set-up frequency in numbers; and a second frequency display unit which shows at least one predetermined frequency range in a graphical form, centering the set-up frequency, on a scale having a fan shape by interlocking the at least one predetermined frequency range with the setting of the frequency performed by the frequency setting unit.

According to another aspect of the present invention, there is provided a method of displaying a frequency, the method including: displaying a set-up frequency set by a frequency setting unit which sets a frequency, in numbers; displaying at least one predetermined frequency range, centering the set-up frequency, on a scale having a fan shape interlocked to the frequency setting performed by the frequency setting unit; showing scale marks in a graphical form at regular intervals corresponding to predetermined frequency intervals, on the scale; and showing numbers of a part of a frequency corresponding to the predetermined frequency range by deleting digits from an upper digit to a first predetermined digit and deleting digits from a lower digit to a second predetermined digit, in the vicinity of a corresponding marking, and such that a virtual center point of the scale having the fan shape is below characters of the numbers.

BRIEF DESCRIPTION OF THE DRAWINGS

The above and other features and advantages of the present invention will become more apparent by describing in detail exemplary embodiments thereof with reference to the attached drawings in which:

FIG. 5 is a diagram showing a process of calculating a display location by a display control unit, according to an embodiment of the present invention;

DETAILED DESCRIPTION OF THE INVENTION

Figure 1:
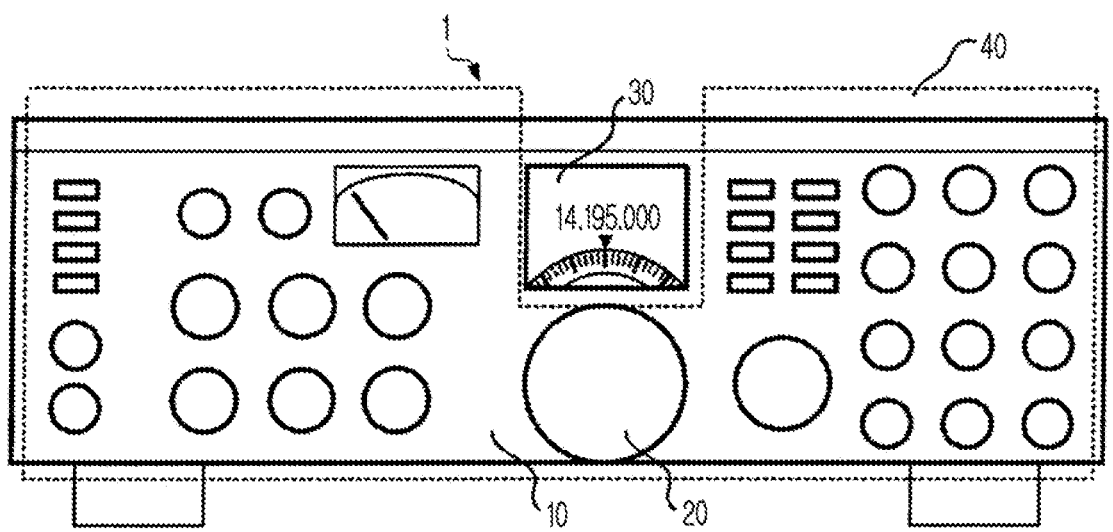
FIG. 1 is a view of an external appearance of a wireless device according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

FIG. 1 is a view of an external appearance of a wireless device 1 according to an embodiment of the present invention.

A front panel 10 of the wireless device 1 includes at least a display unit 30 and a manipulation unit 40.

The manipulation unit 40 includes a switch, a rotating knob, or the like for setting operations of the wireless device 1, for example, adjusting a demodulation volume, setting forms (modes) of radio wave for modulation and demodulation, inputting a frequency according to numbers, and changing a frequency band.

The display unit 30 displays at least a frequency of a signal being transmitted and received. Contents displayed on the display unit 30 will be described in detail later.

The manipulation unit 40 includes a frequency setting knob 20 that is a manipulation knob for continuously changing a frequency of a signal being transmitted and received by the wireless device 1.

Figure 2:
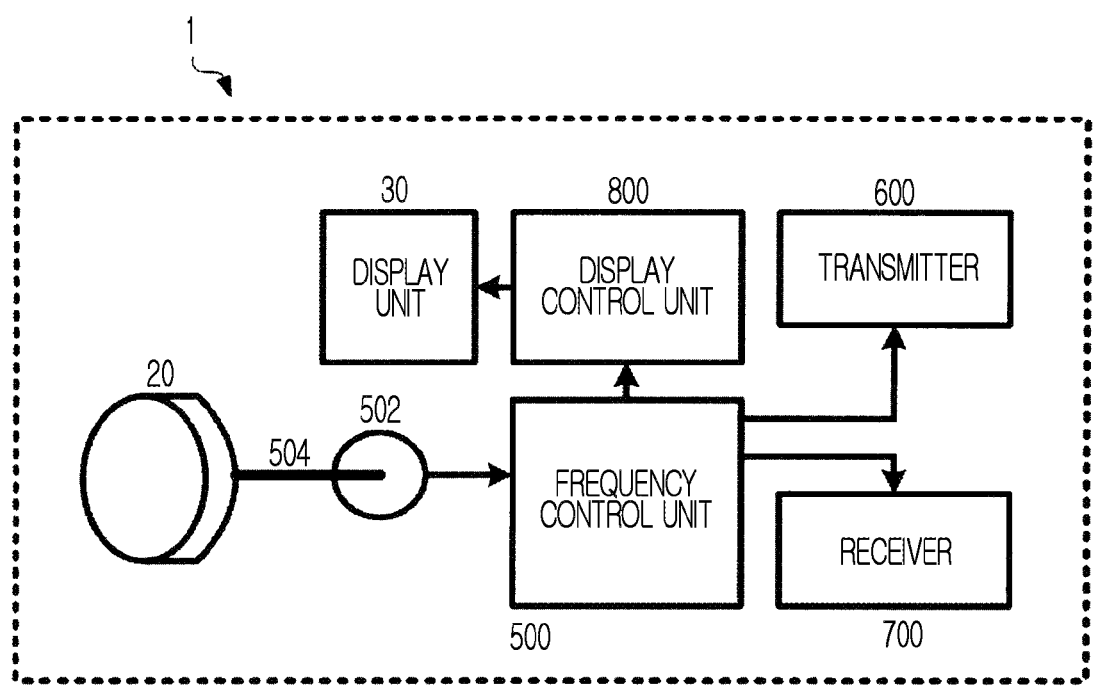
FIG. 2 is a block diagram of a structure of a wireless device according to an embodiment of the present invention.

FIG. 2 is a block diagram of a structure of the wireless device 1 according to an embodiment of the present. The wireless device 1 includes at least a frequency control unit 500, a transmitter 600, a receiver 700, a display control unit 800, the display unit 30, an encoder 502, and the frequency setting knob 20.

The frequency control unit 500 is configured on the basis of a microcomputer including, for example, a central processing unit (CPU) for performing an operation process, or the like, a read only memory (ROM) for storing an operation program, or the like executed by the CPU, and a random access memory (RAM) for temporarily storing process data, or the like. The CPU, the ROM, and the RAM are connected to each other via a data bus, or the like.

The encoder 502, which is, for example, an optical type or a magnetic type, is connected to the frequency control unit 500. The frequency setting knob 20 is attached to a shaft 504 of the encoder 502. The encoder 502 generates a pulse signal having a phase difference according to a rotation direction by rotating the frequency setting knob.

The frequency control unit 500 performs a predetermined process with respect to the pulse signal, and outputs the result to the transmitter 600, the receiver 700, and the display control unit 800, as frequency setting information.

In the predetermined process, the frequency setting information is sequentially changed according to a rotation direction and a rotation amount of the encoder 502.

The frequency setting information may be sequentially changed by, for example, rotating the frequency setting knob 20 in a rightward direction to increase a frequency by a predetermined frequency step, or in a leftward direction to decrease the frequency by the predetermined frequency step.

The transmitter 600 includes, for example, a modulator (not shown) for changing a voice signal to a transmission signal, and a high frequency power amplifier (not shown) for amplifying the transmission signal.

The transmitter 600 controls an oscillation frequency of a frequency oscillator, such as a phase locked loop (PLL) or a direct digital synthesizer (DDS), according to the frequency setting information output from the frequency control unit 500. Accordingly, a transmission frequency is set.

The receiver 700 includes, for example, a band limiting unit (not shown) for limiting a band of a reception signal, a demodulator (not shown) for demodulating the reception signal, and a low frequency power amplifier (not shown) for amplifying the demodulated signal.

The receiver 700 controls the oscillation frequency of the frequency oscillator, such as the PLL or the DDS, according to the frequency setting information output from the frequency control unit 500. Accordingly, a reception frequency is set.

The display control unit 800 is configured on the basis of a microcomputer including, for example, a CPU for performing an operation process, or the like, a ROM for storing an operation program, or the like executed by the CPU, a RAM for temporarily storing process data, or the like, and a display driver in charge of displaying in the display unit 30. The CPU, the ROM, the RAM, and the display driver may be connected to each other via a data bus, or the like.

A digital signal processor (DSP) may be used if an image needs to be processed at a high speed.

The display control unit 500 outputs display setting information allowing the display unit 30 to perform a predetermined display, according to the frequency setting information output from the frequency control unit 500.

The display unit 30 is a display device, such as a liquid crystal display, an organic electroluminescence (EL) device, or an inorganic EL device. The display unit 30 performs displaying based on the display setting information output from the display control unit 800.

The frequency setting knob 20 and the display unit 30 of the wireless device 1, according to an embodiment of the present invention, will be described in detail with reference to FIG. 3.

The display unit 30 is closest to the frequency setting knob 20. In detail, since the frequency setting knob 20 is rotated by hand, the display unit 30 may be disposed near the hand manipulating the frequency setting knob 20, and furthermore, may be disposed above the frequency setting knob 20 so that a display is shown regardless of whether a left or right hand is used, thereby facilitating checking of a change of the frequency via manipulation.

The display unit 30 displays a detailed frequency f1 indicating a transmission and reception frequency in detailed digits (for example, in digits of 1 Hz). Also, the display unit 30 displays a frequency scale 302 that rotates by interlocking with rotation of the frequency setting knob 20.

The frequency scale 302 displays a predetermined frequency range, centering the detailed frequency f1, by using an analog scale, i.e., using markings like a ruler.

The frequency scale 302 is displayed in a fan shape of an approximate concentric circle based on a center of rotation of the frequency setting knob 20. Also, the frequency scale 302 includes markings 304 extending from an outer circumference to an inner circumference of the fan shape. For example, every fifth marking may be thicker and longer than the other markings, and every tenth marking may be longer than every fifth marking.

A partial display f2 of a frequency, wherein a part of a marking is indicated by using numbers, is displayed nearest to every tenth marking, in a direction according to rotation of the frequency scale 302. Also, a pointer 308 indicating a location on a scale corresponding to a numerical value equal to or below predetermined digits of a current operating frequency (the detailed frequency f1) is displayed.

The detailed frequency f1 and the frequency scale 302 are disposed so as to be within a same visual field of a user. Considering all arrangements described above, the detailed frequency f1, the pointer 308, and the frequency scale 302 may be downwardly displayed in this order on the display unit 30, and the frequency setting knob 20 may be disposed below the display unit 30.

The frequency scale 302 enables the user to approximately recognize where the transmission and reception frequency is in a frequency band, without moving line-of-sight of the user.

The frequency scale 302 does not need to accurately read all frequency values of the detailed frequency f1.

A resolution of a frequency read from the frequency scale 302 may be, for example, a resolution capable of facilitating recognition of a bandwidth of a form of radio wave used for transmission and reception in a band where the detailed frequency f1 exists. The recognizing of the bandwidth means, when there is a signal currently being received, understanding of how much detuning from the received signal enables transmission without affecting communication currently being performed.

For example, the markings 304 of the frequency scale 302 may facilitate recognition of a unit of kHz since a bandwidth of a form of radio wave used in a frequency band for transmission and reception is 3 kHz in an upper side band (USB), and 6 kHz in amplitude modulation (AM).

Also, in order to increase or decrease a number of a predetermined upper digit (for example, a digit of 1 MHz) of the detailed frequency f1, the frequency setting knob 20 is rotated relatively many times. Thus, since a number of an upper digit does not frequently change, the frequency scale 302 does not need to recognize a predetermined upper digit, or above, of the detailed frequency f1. For example, a digit equal to or above MHz may be unrecognizable.

Figure 3:
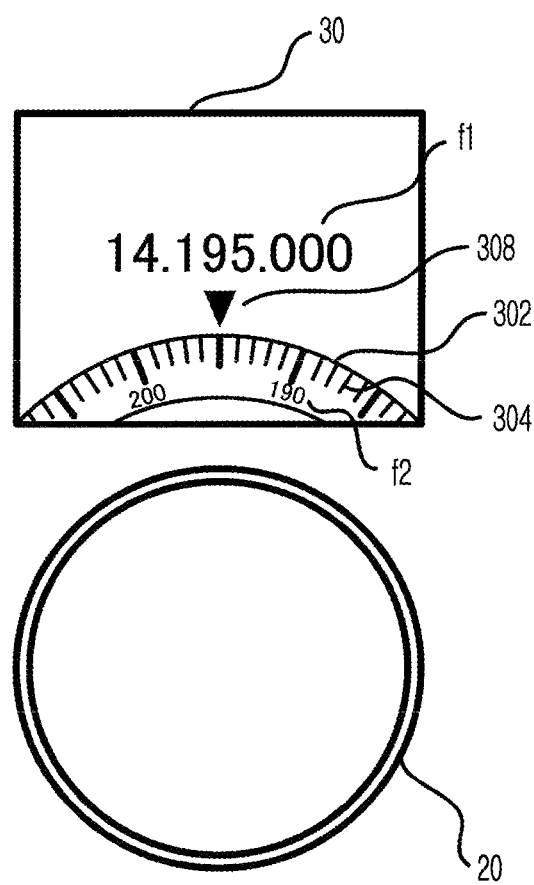
FIG. 3 is a diagram showing in detail a display unit and a frequency setting knob, according to an embodiment of the present invention.

As shown in FIG. 3, a digit of 1 kHz from 000 to 999 kHz may be directly read by using markings corresponding to 1 kHz in the frequency scale 302, and setting a numerical value swing on a scale to a numerical value corresponding to digits from 1 kHz to 100 kHz. It may be instantaneously determined to be operated between 14.190 MHz and 14.200 MHz based on an upper digit (MHz band) of the detailed frequency f1 i.e., 14 MHz, and numbers 190 and 200 of the partial display f2 displayed on the frequency scale 302, which are in the visual field of the user.

Accordingly, numbers corresponding to all digits of the detailed frequency f1 do not need to be displayed on the frequency scale 302, and numbers do not need to be marked for all markings. For example, numbers may be displayed only on markings at locations of rounded frequencies (numbers).

Figure 4:
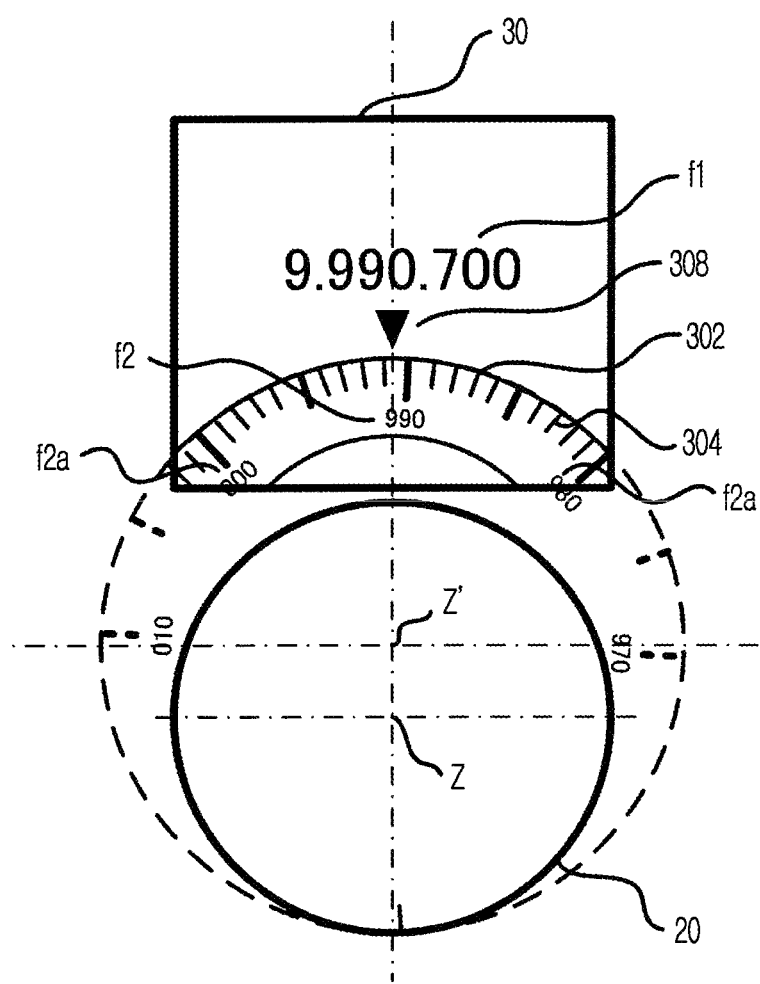
FIG. 4 is a diagram showing locations of the display unit and the frequency setting knob, according to an embodiment of the present invention.

The partial display f2 that indicates numbers in the frequency scale 302 may be rounded numbers as described above. The partial display f2 may not be limited to display digits of 1 to 100 kHz in every 10 kHz (000, 010, . . . 980, 990) as shown in FIG. 4. It would suffice that the partial display f2 is recognizable by the user, or the markings are not overcrowded or depopulated on the display unit 30 in terms of a design of the wireless device 1.

The locations of the markings 304 in the frequency scale 302 are always calculated by the display control unit 800 based on the frequency setting information (data of the detailed frequency f1) obtained from the frequency control unit 500. Accordingly, the markings of the frequency scale 302 are displayed by being rotated around a virtual center Z' having the fan shape of the frequency scale 302 of FIG. 4, according to a change of the frequency setting information wherein a frequency is continuously increased or decreased by the frequency control unit 500.

Like the markings 304, the partial display f2 in the frequency scale 302 is always calculated by the display control unit 800 based on the frequency setting information (data of the detailed frequency f1) obtained from the frequency control unit 500. Also, the partial display f2 is displayed nearest to a corresponding marking as shown in FIG. 4, by using a direction of the virtual center Z' of the frequency scale 302 as a lower direction.

Also, as shown in FIG. 4, the partial display f2 may be partially displayed as denoted by a reference numeral f2a, wherein the partial display f2 is not displayed in a complete form within a display region of the display unit 30, according to a value of the detailed frequency f1. The display control unit 800 may obtain a predetermined frequency portion of an upper limit frequency and a predetermined frequency portion of a lower limit frequency based on a scale range of the frequency scale 302 by calculation.

The detailed frequency f1 indicates details of an operation frequency capable of current transmission and reception in numerical values, but the frequency scale 302 displays numerical values of a part of the detailed frequency f1 in an analog location.

Hereinafter, a method of obtaining locations of the markings 304 and the partial display f2 will be described in detail.

As shown in FIG. 4, the frequency scale 302 is displayed on the display unit 30, in a fan shape based on the virtual center point Z'. The display control unit 800 may designate the locations of the markings 304 by designating angles of displaying the markings 304, considering that the frequency scale 302 is a circle around the virtual center point Z'.

FIG. 5 is a diagram showing processes of obtaining a numerical value denoting the frequency scale 302, an angle corresponding to the numerical value, an angle for displaying markings, and an angle for displaying the partial display f2, from data of the detailed frequency f1.

The display control unit 800 obtains the data of the detailed frequency f1, i.e., "A" in FIG. 5, from the frequency setting information. The display control unit 800 calculates information for displaying the data of the detailed frequency f1 as an intermediate value of the frequency scale 302, i.e., displaying a value of a scale indicated by the pointer 308 as "B" that is a value of a scale in an immediate upper direction of the frequency scale 302.

The display control unit 800 sets an angle in an immediate upper direction around the virtual center point Z' based on the frequency setting information as a numerical value "B" that is lower than or equal to first predetermined digits of the detailed frequency f1, and assigns a numerical value "C" in a positive direction of a predetermined range from the numerical value "B" that is lower than or equal to the first predetermined digits of the detailed frequency f1, and a numerical value "D" in a negative direction of the predetermined range from the numerical value "B" lower than or equal to the first predetermined digits of the detailed frequency f1. Here, an order of assignment is not limited thereto.

In detail, referring to FIG. 4, the display control unit 800 sets a numerical value ("B" in FIG. 5) "990,700" that is lower than or equal to digits of 100 kHz of 9,990,700 Hz, at an angle (90°) in an immediate upper direction where the pointer 308 indicates. The numerical value "990,700" may be considered to be a remainder obtained by dividing (1) the detailed frequency f1 by 1,000,000.

Hereinafter, same divisions are classified based on a numerical value within brackets.

Also, a numerical value may be pre-determined per 1°, and the numerical value may be assigned according to an angle in a range at least displayable on the display unit 30.

For example, when "1,000" is determined per 1° and "990,700" is set to "B" as an intermediate value, a numerical value in a positive direction indicated by "C" may be 91,000° in "991,700" and 92,000° in "992,700", and a numerical value in a negative direction indicated by "D" may be 89.000° in "989,700" and 88.000° in "988,700".

A range for displaying the markings 304 on the frequency scale 302 may be calculated to be a somewhat large range since a part of the markings 304 may not be displayed in a display range of the display unit 30.

For example, when a range of ±20 kHz is calculated, an angle is assigned with respect to a value ("970,700" to "010,700") corresponding to 9,970,700 Hz to the right of a scale and 10,010,700 Hz to the left of the scale. A digit is not increased even when a value is above "999,999". This is the same process of obtaining "B" that the remainder is obtained by dividing (1) the detailed frequency f1 by 1,000,000, wherein a digit that is not required with respect to calculation is deleted.

In addition, the display control unit 800 indicates locations (angles) of displaying scale marks at an angle "F" corresponding to a numerical value "E", wherein a remainder is 0 by dividing (2) a numerical value lower than or equal to second predetermined digits by a predetermined value (numerical value corresponding to 1 kHz).

In detail, referring to FIG. 5, since the detailed frequency f1 is 9,990,700 Hz, the intermediate value A of the frequency scale 302 is B "990,700". Since 700 remains leftover when B "990,700" is divided (2) by 1000 (numerical value corresponding to 1 kHz), a scale mark is not displayed.

The display control unit 800 performs a calculation based on B "990,700". For example, when the calculation is performed within a range ("970,700" to "010,700") corresponding to ±20 kHz, a remainder of dividing (2) "971,000", "990,000", "991,000", "000,000", and "010,000" indicated in "E" by 1,000 is 0. Accordingly, a scale mark is displayed on a location of an angle "F" corresponding to such a numerical value.

Correspondence between an angle and a numerical value may be arbitrarily set. For example, a numerical value per 1° may be 1,000 to display markings per 1°, and one marking of a scale may display 1 kHz.

In a similar manner, angles whose remainder is 0 when being divided (2) by 5,000 may be used to display scale marks per 5 kHz that are thicker than scale marks per 1 kHz.

In the similar manner, angles whose remainder is 0 when being divided (2) by 10,000 may be used to display scale marks per 10 kHz that are longer than scale marks per 5 kHz.

Unlike scale marks, the partial display f2 displays numerical values in numbers.

Thus, the display control unit 800 obtains numerical values of angles and numbers to be displayed. The angle may be obtained by calculating locations (angles) of markings as described above. Then, numerical values and numbers are marked together, but the numerical values are values regarding the calculation and the numbers denote characters to be displayed.

The display control unit 800 obtains the data of the detailed frequency f1, i.e., "A" in FIG. 5, from the frequency setting information. The information for displaying the data of the detailed frequency f1 as the intermediate value of the frequency scale 302, i.e., the value of the scale indicated by the pointer 308, and the value of the scale in the immediate upper direction of the frequency scale 302, i.e., "B" in FIG. 5, is calculated.

The display control unit 800 sets an angle in an immediate upper direction around the virtual center point Z' based on the frequency setting information, as the numerical value "B" that is lower than or equal to the first predetermined digits of the detailed frequency f1. Also, the display control unit 800 assigns the numerical value "C" in the positive direction of the predetermined range from the numerical value "B" that is lower than or equal to the first predetermined digits of the detailed frequency f1, and the numerical value "D" in the negative direction of the predetermined range from the numerical value "B" that is lower than or equal to the first predetermined digits of the detailed frequency f1. Here, an order of assignment is not limited.

Also, the display control unit 800 set an angle "H" corresponding to a numerical value whose remainder is 0 when a numerical value that is lower than or equal to the third predetermined digits is divided (3) by a predetermined value (numerical value corresponding to 10 kHz), as an angle for displaying a number "J" that is a numerical value "J" of a result of the division.

In detail, referring to FIG. 4, the display control unit 800 sets the numerical value "990,700" ("B" in FIG. 5) lower than or equal to digits of 100 kHz of 9,990,700 Hz, at the angle (90°) in the immediate upper direction where the pointer 308 indicates. The numerical value "990,700" may be the remainder obtained by dividing (1) the detailed frequency f1 by 1,000,000.

According to such a division (1), the numerical value B "990,700" that is lower than or equal to digits of 100 kHz of 9,990,700 Hz is set as the intermediate value of the frequency scale 302, i.e., at the angle (90°) in the immediate upper direction where the pointer 308 indicates. Also, a numerical value may be pre-determined per 1° in advance, and the numerical value "B" may be assigned according to an angle in a range that is at least displayable on the display unit 30.

For example, when "1,000" is determined per 1 and "990,700" is set to "B" as an intermediate value, a numerical value in a positive direction indicated by "C" may be 91.000° in "991,700" and 92.000° in "992,700", and a numerical value in a negative direction indicated by "D" may be 89.000° in "989,700" and 88.000° in "988,700".

A range for displaying the partial display f2 on the frequency scale 302 may 1a be calculated to be a somewhat large range since a part of the partial display f2 may not be displayed in a display range of the display unit 30 as denoted by the reference numeral f2a.

For example, when a range of ±20 kHz is calculated, an angle is assigned with respect to a value ("970,700" to "010,700") corresponding to 9,970,700 Hz to the is right of the scale and 10,010,700 Hz to the left of the scale.

Also, the display control unit 800 sets an angle "H" corresponding to a numerical value "G" whose remainder is 0 by dividing (3) a numerical value that is lower than or equal to the third predetermined digits by a predetermined value (numerical value corresponding to 10 kHz), as an angle for displaying a number "J".

In detail, referring to FIG. 5, since the detailed frequency f1 is 9,990,700 Hz, the intermediate value "B" of the frequency scale 302 is "990,700". Since "0, 700" remains leftover when "990,700" is divided (3) by 10,000, "990,700" is not marked at an angle where the partial display f2 is displayed in numbers.

The display control unit 800 performs calculation based on B "990,700". For example, when calculation is performed within a range ("970,700" to "010,700") corresponding to ±20 kHz, remainders obtained by dividing (4) "980,000", "990,000", "000,000", and "010,000" indicated by "G" by 10,000 are 0. Accordingly, locations of angles "H" corresponding to such numerical values are locations where numbers are displayed.

The number "J" (the partial display f2) to be displayed may be in predetermined digits. However, since it is common to display a frequency in 1000 digits, such as kHz or MHz, the numerical values "J", i.e., "980", "990", "000", and "010", obtained by dividing (4) the numerical values, such as "980,000", "990,000", "000,000", and "010,000", by 1,000, are displayed.

As described above, the display control unit 800 may obtain the number "J" and the location (angle) "H" of the partial display f2.

Also, the display control unit 800 displays the number "J" of the partial display f2 at the location (angle) by using a virtual center Z' direction of the frequency scale 302 as a lower direction.

The partial display f2 is rotated by interlocking with a rotation of the frequency scale 302. In other words, when a frequency is changed by rotating the frequency setting knob 20, the partial display f2 that is a display according to a rotation direction is also rotated in an approximate concentric circle around the frequency setting knob 20, and thus a display corresponding to the detailed frequency f1 is displayed. Accordingly, a disk on which markings are marked is displayed to be rotated as numbers are turned by interlocking with the rotation of the frequency setting knob 20.

The frequency scale 302 may be displayed by virtualizing a rotating disk, but as shown in FIG. 4, a center Z of the frequency setting knob 20 and a virtual center Z' of the frequency scale 302 may not completely match.

However, when the center Z and the virtual center Z' are too far from each other, the user may not feel that the frequency scale 302 is rotated on an approximate concentric circle with respect to manipulation performed on the frequency setting knob 20. Accordingly, a virtual center point of the frequency scale 302 may be disposed on an inner circumference rather than an outer circumference of the frequency setting knob 20.

According to an embodiment, the partial display f2 in a scale displays 1 to 100 kHz digits, but this is only an example, and digits are arbitrary.

For example, 1 marking may correspond to 50 kHz, and the partial display f2 may be 100, 200, 300, and so on, with every tenth marking to correspond to 100 kHz.

Also, even if the digits of the partial display f2 are from 1 to 100 kHz, when the reception frequency is a long wave less than 100 kHz, for example, from 50,000 Hz to 99.999 Hz, "0" in upper digits of the partial display f2 may be deleted.

The present invention is not limited to the one or more embodiments described above, and may vary.

For example, a range of the frequency scale 302, i.e., a frequency per marking, may vary according to a form of radio wave.

When the form of a radio wave is a continuous wave (CW), in order to remove interference from another station in a near-by frequency, a band controlled by a band limiting unit may be set to be narrow, for example, 500 Hz or 250 Hz. Although the frequency scale 302 is a unit for briefly recognizing a frequency, a relationship between a reception station and a frequency can be determined only from the detailed frequency f1, since there may be a plurality of stations within 1 marking, in markings where 1 marking corresponds to 1 kHz. Accordingly, by displaying one marking to correspond to 100 Hz, the relationship between the reception station and the frequency may be easily recognized at the location indicated by the frequency scale 302.

When the form of a radio wave is frequency modulation (FM), a band limiting unit may normally set 20 kHz for an amateur radio. Here, since the necessity of markings per 1 kHz is reduced, markings may be displayed per 5 kHz or 10 kHz.

Also, a change amount of a frequency with respect to the rotation amount of the frequency setting knob 20 may be timely settable.

For example, when a pulse number per one rotation of an encoder is 1000 pulses and a frequency is changed by 1 Hz in one pulse, the frequency is changed by 1 kHz by rotating the frequency setting knob 20 once.

Since one marking of the frequency scale 302 of FIG. 3 is 1 kHz, when the frequency setting knob 20 is rotated once, the frequency scale 302 is displayed after rotating by one marking. In other words, the rotation of the frequency scale 302 is interlocked to the rotation of the frequency setting knob 20, but a rotating speed of the display of the frequency scale 302 is reduced with respect to a rotating speed of the frequency setting knob 20.

The frequency scale 302 is always calculated by the display control unit 800 based on the frequency setting information (data of the detailed frequency f1) obtained from the frequency control unit 500.

Accordingly, even when a frequency is set by manipulating a number key of the manipulation unit 40, the frequency scale 302 is instantaneously re-shown such that the frequency scale 302 corresponding to the detailed frequency f1 is displayed.

Also, according to frequency scanning that is an operation wherein a frequency is changed every predetermined time in a predetermined frequency interval by interlocking with the detailed frequency f1, when the frequency is increased in the frequency scanning, the frequency scale 302 is rotated in a clockwise direction, and when the frequency is decreased in the frequency scanning, the frequency scale 302 is rotated in a counterclockwise direction.

Figure 6:
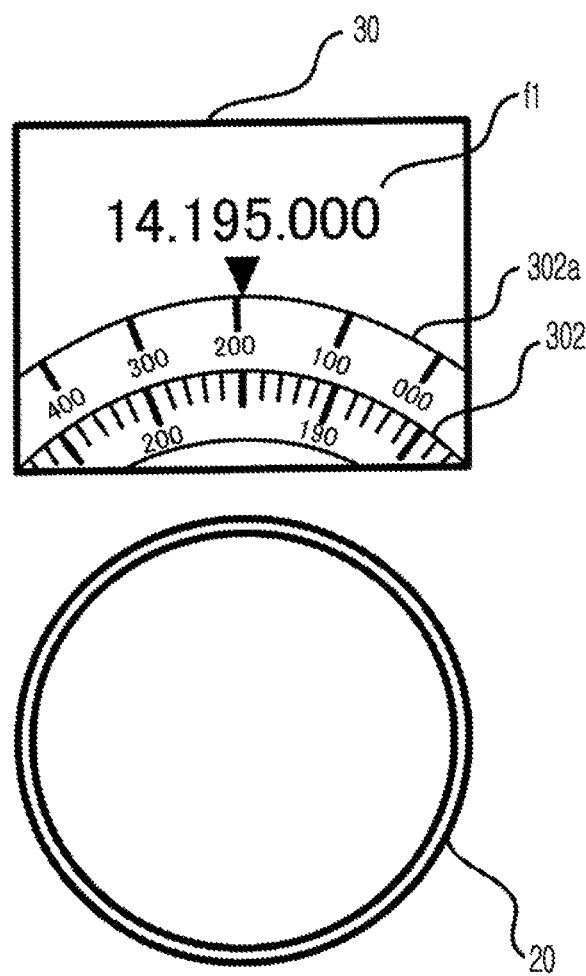
FIG. 6 is a diagram of two frequency scales shown on a display unit, according to an embodiment of the present invention.

The number of frequency scales 302 may not be 1, and two frequency scales may be displayed as shown in FIG. 6, wherein the frequency scale 302 shows 1 kHz per marking and a frequency scale 302a shows 100 kHz per marking.

Also, in a frequency band assigned to an amateur radio or a broadcasting band of a short wave band, a color of a scale or pointer in the corresponding frequency band of the frequency scale 302 may be changed.

Figure 7:
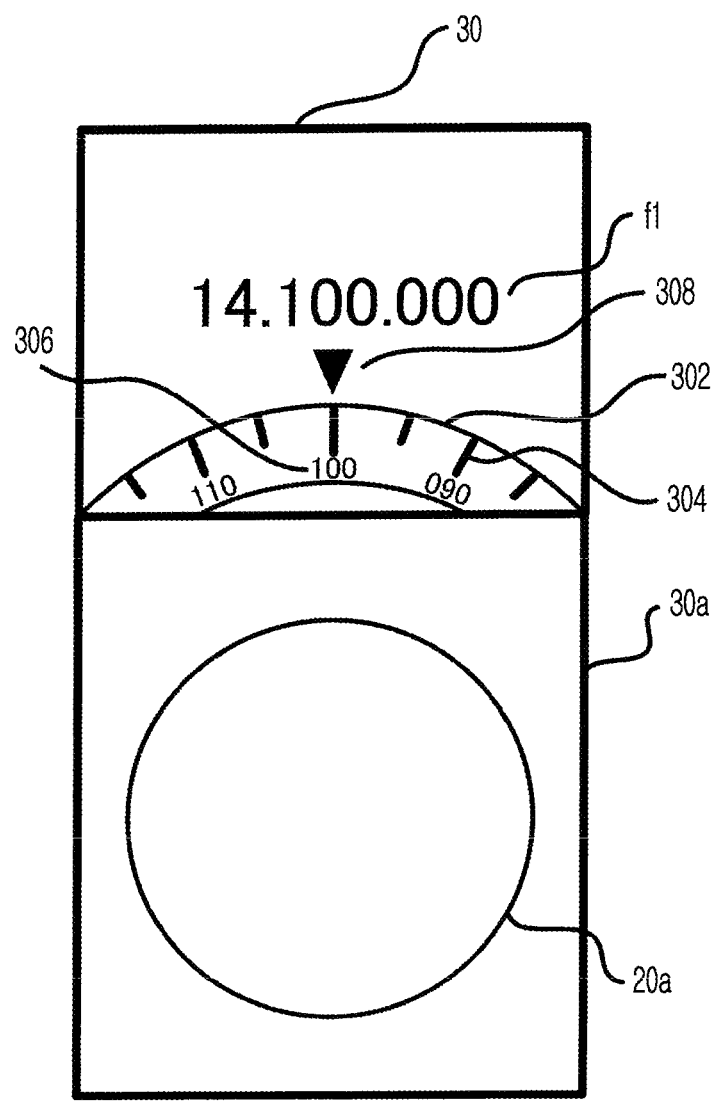
FIG. 7 is a diagram of a dial shown on a touch panel, according to an embodiment of the present invention.

The frequency setting knob 20 is not limited to a real dial, and as shown in FIG. 7, a frequency manipulation unit 30a may be a touch panel and an imaged dial 20a may be drawn in a graphical form on the touch panel. Then, the imaged dial 20a may be re-shown to be rotated by a finger so that a frequency is changed. Alternatively, the imaged dial 20a may be rotated according to manipulation.

Figure 8:
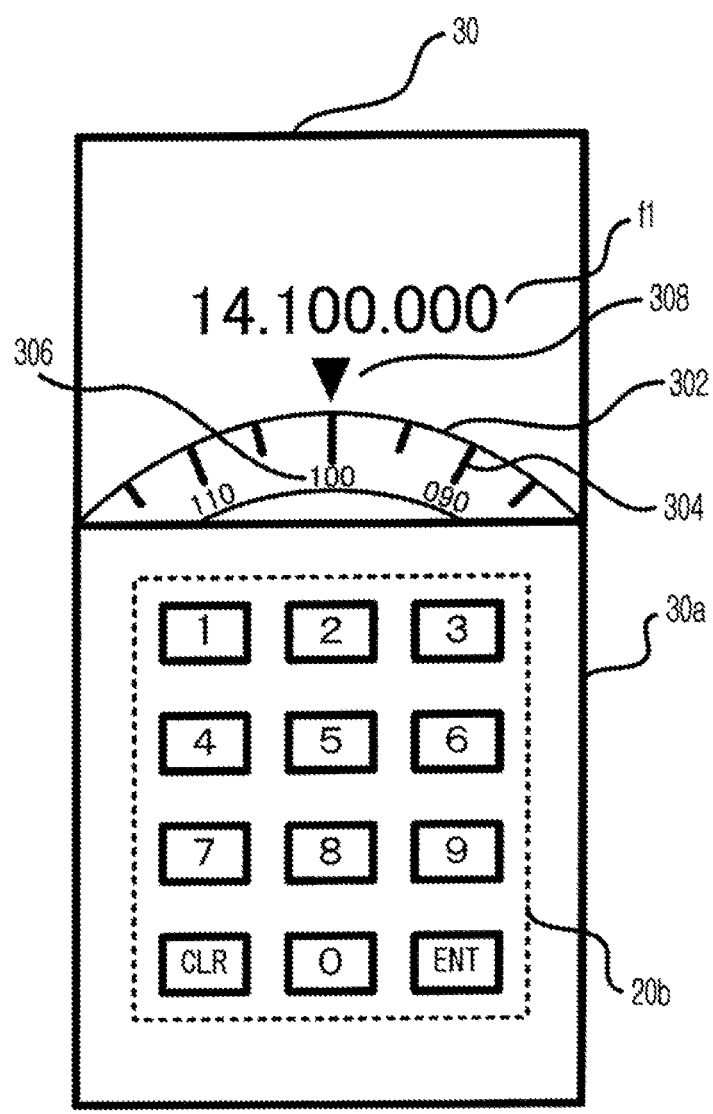
FIG. 8 is a diagram of a number pad shown on a touch panel, according to an embodiment of the present invention.

Alternatively, as shown in FIG. 8, a number pad 20b may be displayed on a touch panel, and numbers may be input by touching numbers on the touch panel to set the detailed frequency f1.

According the present invention, a wireless device and a method of displaying a frequency, wherein displaying of an analog frequency scale having a small line-of-sight movement is realized, can be provided.

While this invention has been particularly shown and described with reference to exemplary embodiments thereof, it will be understood by those of ordinary skill in the art that various changes in form and details may be made therein without departing from the spirit and scope of the invention as defined by the appended claims.

What is claimed is:

1. A wireless device comprising:
a frequency setting unit which sets a frequency;
a first frequency display unit which displays the set frequency as a set-up frequency in numbers; and
a second frequency display unit which shows at least one predetermined frequency range in a graphical form, centering the set-up frequency, on a scale having a fan shape by interlocking the at least one predetermined frequency range with the setting of the frequency performed by the frequency setting unit,
wherein the second frequency display unit shows scale marks in a graphical form at regular intervals corresponding to predetermined frequency intervals on the scale, and shows numbers of a part of a frequency corresponding to the predetermined frequency range in a graphical form by deleting digits from an upper digit to a first predetermined digit and deleting digits from a lower digit to a second predetermined digit, in the vicinity of a corresponding marking, and such that a virtual center point of the scale having the fan shape is below characters of the numbers.

2. The wireless device of claim 1, wherein the second frequency display unit calculates displayed characters and character locations, and markings and marking locations, on the basis of frequency setting data of the set-up frequency.

3. The wireless device of claim 1, wherein the second frequency display unit changes the at least one predetermined frequency interval that is a frequency per each marking of the markings, according to a form of a radio wave.

4. The wireless device of claim 1, wherein the frequency setting unit includes a frequency changing unit capable of changing a frequency according to a rotation operation,
  wherein a center of the rotation operation of the frequency changing unit is disposed approximately on a concentric circle around the virtual center point of the scale.

5. The wireless device of claim 4, wherein, when the set-up frequency set by the frequency changing unit is changed, the first frequency display unit displays the set-up frequency changed by the frequency changing unit in numbers, and the second frequency display unit shows the scale in a graphical form such that a center of the scale always corresponds to the changed set-up frequency so that the scale having the fan shape is rotated about the virtual center point.

6. The wireless device of claim 1, wherein the numbers displayed by the first frequency display unit and the scale displayed by the second frequency display unit are displayed on a same display unit.

7. The wireless device of claim 1, wherein the second frequency display unit shows a plurality of different predetermined frequency ranges in a graphical form on a plurality of scales having fan shapes in concentric circles, centering the set-up frequency.

8. A method of displaying a frequency, the method comprising:
  displaying a set-up frequency set by a frequency setting unit which sets a frequency, in numbers;
  displaying at least one predetermined frequency range, centering the set-up frequency, on a scale having a fan shape interlocked to the frequency setting performed by the frequency setting unit;
  showing scale marks in a graphical form at regular intervals corresponding to predetermined frequency intervals, on the scale; and
  showing numbers of a part of a frequency corresponding to the predetermined frequency range in a graphical form by deleting digits from an upper digit to a first predetermined digit and deleting digits from a lower digit to a second predetermined digit, in the vicinity of a corresponding marking, and such that a virtual center point of the scale having the fan shape is below characters of the numbers.

* * * * *